United States Patent
Hocevar

(10) Patent No.: US 7,730,377 B2
(45) Date of Patent: *Jun. 1, 2010

(54) LAYERED DECODING OF LOW DENSITY PARITY CHECK (LDPC) CODES

(75) Inventor: Dale E. Hocevar, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1199 days.

This patent is subject to a terminal disclaimer.

(21) Appl. No.: 11/119,100

(22) Filed: Apr. 29, 2005

(65) Prior Publication Data

US 2006/0020870 A1  Jan. 26, 2006

Related U.S. Application Data

(60) Provisional application No. 60/590,761, filed on Jul. 22, 2004.

(51) Int. Cl.
 *H03M 13/03* (2006.01)
(52) U.S. Cl. ............... 714/752; 714/6; 714/800; 714/804
(58) Field of Classification Search ............ 714/752, 714/6, 800, 804
 See application file for complete search history.

(56) References Cited

U.S. PATENT DOCUMENTS 4,404,674 A * 9/1983 Rhodes .................. 714/793

| 6,633,856 | B2 | 10/2003 | Richardson |
| 7,237,181 | B2 * | 6/2007 | Richardson ............ 714/780 |
| 2003/0023917 | A1 | 1/2003 | Richardson |
| 2004/0034828 | A1 | 2/2004 | Hocevar |
| 2004/0194007 | A1 | 9/2004 | Hocevar |
| 2006/0015802 | A1 | 1/2006 | Hocevar |

OTHER PUBLICATIONS

Guilloud, R. et al., "-Min Decoding Algorithm Of Regualr And Irregular LDPC Codes," International Symposium On Turbo Codes, Brest, France, Sep. 1-5, 2003, pp. 451-454.

Gunnam, K. et al., "An LDPC Decoding Schedule For Memory Access Reduction," IEEE International Conference On Acoustics, Speech And Signal Processing (ICASSP), Montreal, May 2004, pp. V:173-176.

(Continued)

*Primary Examiner*—M. Mujtaba K Chaudry
*Assistant Examiner*—Enam Ahmed
(74) *Attorney, Agent, or Firm*—Steven A. Shaw; W. James Brady; Frederick J. Telecky, Jr.

(57) ABSTRACT

A system for decoding in layers data received from a communication channel, comprising a first adder module adapted to determine an extrinsic estimate using a probability value estimate and a check node value estimate, the probability value estimate and the check node value estimate associated with a parity check matrix. The system also comprises a plurality of parity check update modules (PCUMs) in parallel with each other, coupled to the first adder module and adapted to update the check node value estimate, and a second adder module coupled to the plurality of PCUMs and adapted to update the probability value estimate using the extrinsic estimate and the updated check node value estimate. The PCUMs process at least some columns of at least some rows of the parity check matrix in a serial fashion.

25 Claims, 4 Drawing Sheets

OTHER PUBLICATIONS

Jones, C. et al., "Approximate-Min* Constraint Node Updating For LDPC Code Decoding," IEEE Military Communications Conference (MILCOM), Oct. 2003, pp. 157-162.

Mansour, M. M., et al., "A Novel Design Methodology for High Performance Programmable Decoder Cores for AA-LDPC Codes," IEEE Workshop On Signal Process Systems (SIPS), Aug. 2003, pp. 29-34.

Olcer, S., "Decoder Architecture for Array-code Based LDPC Codes," IEEE Global Telecomm. Conf. (GLOBECOM), San Francisco, CA., Dec. 2003, pp. 2046-2050.

Rosenthal, J. et al., "Constructions Of Regular And Irregular LDPC Codes Using Ramanujan Graphs And Ideas From Margulis," Proceedings IEEE International Symposium On Information Theory, Washington, D.C., Jun. 2001, p. 4.

Sridhara, D. et al., "Low Density Parity Check Codes From Permutation Matrices," Conference On Information Sciences And Systems., The John Hopkins University, Mar. 2001, one page.

Zhong, H. et al., "Design Of VLSI Implementation-Oriented LDPC Codes," IEEE Vehicular Technical Conference (VTC Fall), Oct. 2003, pp. 670-373.

Hocevar, Dale E., U.S. Appl. No. 11/056,755, filed Feb. 11, 2005, 21 pages, including 5 sheets of formal drawings.

* cited by examiner

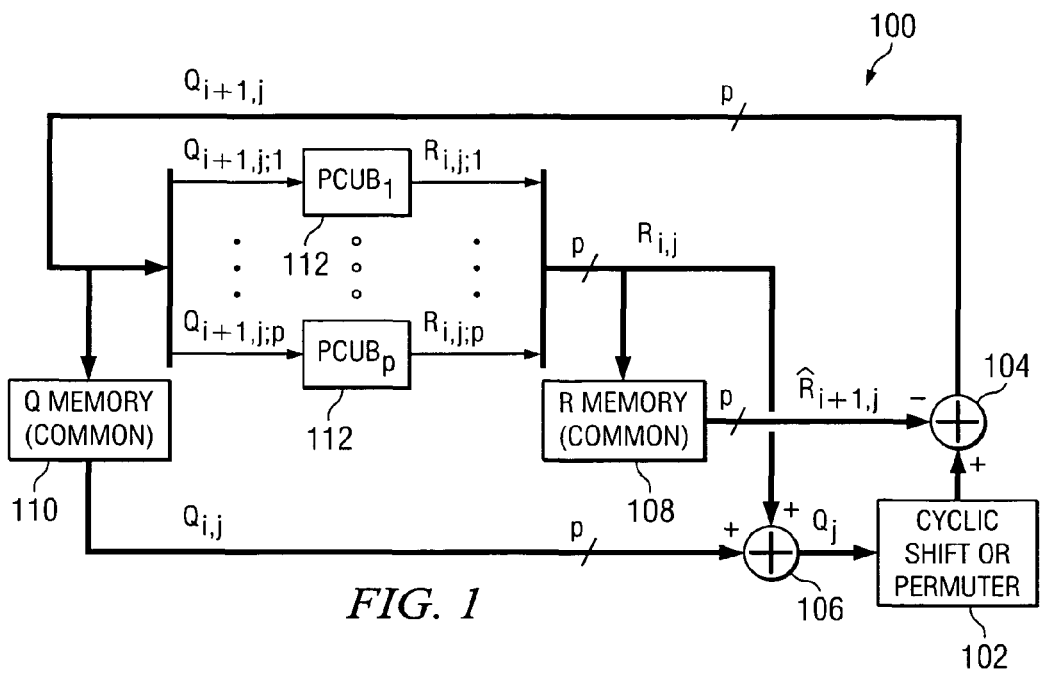
FIG. 1
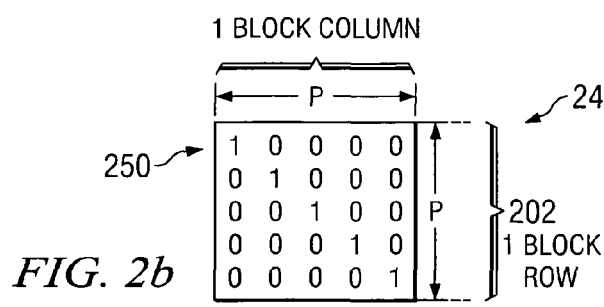
FIG. 2a
FIG. 2b

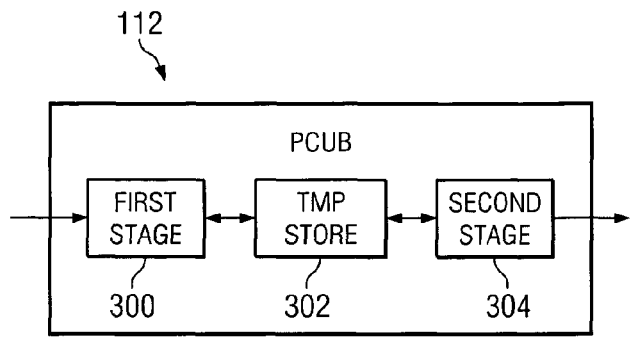
*FIG. 3*
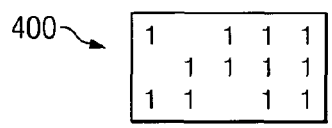
*FIG. 4*
| Q BLOCK INDICES INTO PCUB | R BLOCK INDICES OUT OF PCUB |
|---|---|
| (1,1) | (3,1) |
| (1,3) | (2,3) |
| (1,4) | (3,4) |
| (1,5) | (3,5) |
| (2,2) | (3,2) |
| (2,3) | (1,3) |
| (2,4) | (1,4) |
| (2,5) | (1,5) |
| (3,1) | (1,1) |
| (3,2) | (2,2) |
| (3,4) | (2,4) |
| (3,5) | (2,5) |
*FIG. 5*
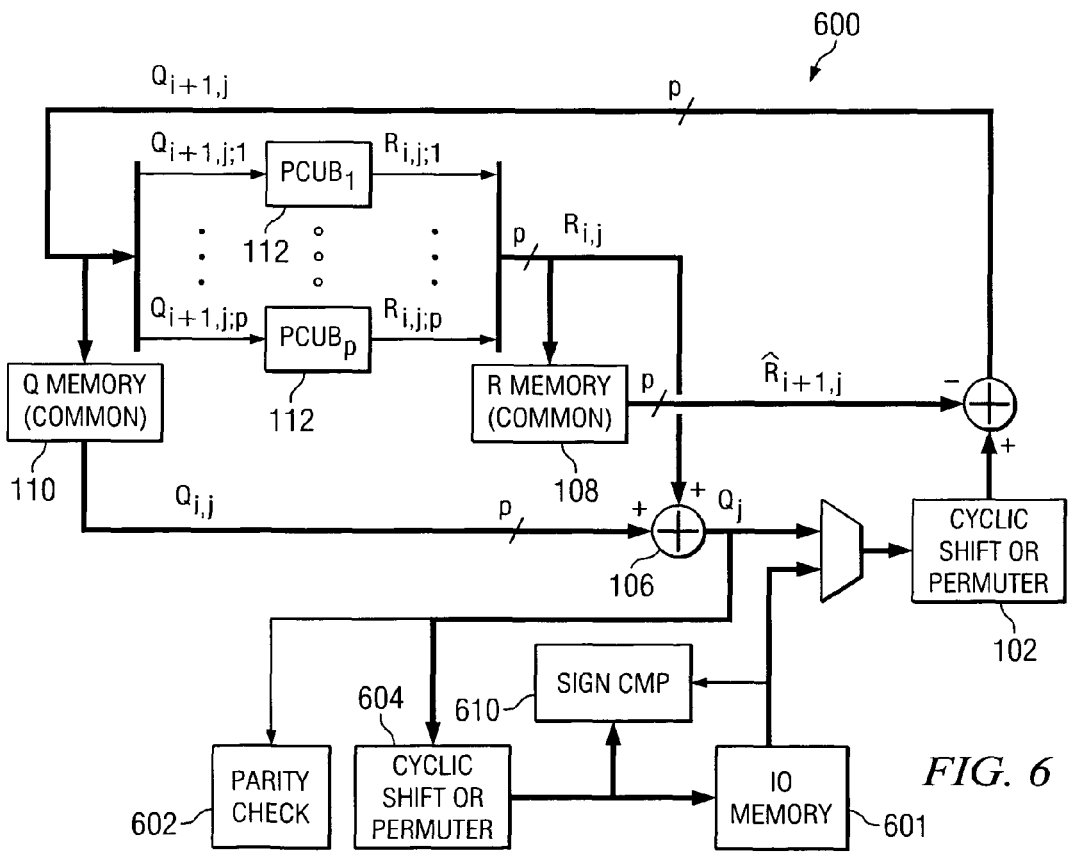
*FIG. 6*

LAYERED DECODING OF LOW DENSITY PARITY CHECK (LDPC) CODES

RELATED APPLICATIONS

This application claims priority to the following Provisional Patent Application incorporated herein by reference: Appl. No. 60/590,761, entitled "Architecture for Layered Decoding of LDPC Codes" and filed Jul. 22, 2004.

BACKGROUND

One problem that is common to many data communications technologies is the corruption of data due to noise. The signal-to-noise ratio (SNR) for a communications channel is an indication of the quality of the communications carried out over that channel, as it conveys the relative strength of the signal that carries the data (as attenuated over distance and time) to the noise present on that channel. These factors relate directly to the likelihood that a data bit or symbol received over the channel is in error relative to the data bit or symbol as transmitted. This likelihood is reflected by the error probability for the communications over the channel, commonly expressed as the Bit Error Rate (BER) which is a ratio of bits that are received and decoded in error to total bits transmitted. In general, the likelihood of error in data communications should be considered in developing a communications technology. Techniques for detecting and correcting errors in the communicated data should be incorporated for the communications technology to be useful.

To this end, error detection and correction techniques are implemented through the use of redundant coding of the data. In general, redundant coding comprises inserting data bits into the transmitted data stream that do not add any additional information, but that indicate whether an error is present in the received data stream. More complex codes provide the ability to deduce the true transmitted data from a received data stream, despite the presence of errors.

One class of redundant codes is the Low Density Parity Check (LDPC) code, described in further detail below. Among others, one technique that may be used to decode LDPC codes is layered decoding, wherein multiple rows of a parity check matrix are grouped together into layers, and these layers are processed in successive order. Various decoding architectures may be used to decode in layers a particular type of LDPC code. However, these decoding architectures are inflexible in that the architectures generally are able to decode only one or a few types of LDPC codes.

SUMMARY

Some or all of the problems noted above are addressed by an architecture for the layered decoding of low density parity check (LDPC) codes. One exemplary embodiment may be a system for decoding in layers data received from a communication channel, comprising a first adder module adapted to determine an extrinsic estimate using a probability value estimate and a check node value estimate, the probability value estimate and the check node value estimate associated with a parity check matrix. The system also comprises a plurality of parity check update modules (PCUMs) in parallel with each other, coupled to the first adder module and adapted to update the check node value estimate, and a second adder module coupled to the plurality of PCUMs and adapted to update the probability value estimate using the extrinsic estimate and the updated check node value estimate. The PCUMs process at least some columns of at least some rows of the parity check matrix in a serial fashion.

Another embodiment may be a decoder usable in a communication system, comprising multiple parity check update modules (PCUMs) adapted to update check node values associated with a parity check matrix, an adder module coupled to at least one PCUM and adapted to update probability value estimates associated with the check node values, and a cyclic shift or permuter module (CSPM) coupled to at least one PCUM and adapted to rearrange data. The decoder is capable of simultaneously processing groups of data blocks.

Yet another embodiment may be a method of decoding a data stream encoded according to a low density parity check (LDPC) code. The method comprises receiving a set of input values corresponding to input nodes of a parity check matrix, and for each subset of rows of the parity check matrix, repeating an algorithm. The algorithm may comprise, for each row of the subset, producing an extrinsic estimate by subtracting a check node value from a probability value for at least one input node, generating an updated check node value using the extrinsic estimate, and for at least one input node, updating the probability value using the updated check node value and the extrinsic estimate. The steps of producing, generating and updating are performed over at least some columns of at least some rows of the parity check matrix in a serial fashion.

Yet another embodiment may be a decoder usable in a communication system, comprising multiple parity check update modules (PCUMs) adapted to determine updated check node values associated with a parity check matrix, an adder module coupled to at least one PCUM and adapted to update probability value estimates associated with the check node values, a cyclic shift or permuter module (CSPM) coupled to at least one PCUM and adapted to rearrange data, and a memory coupled to at least one of the PCUMs and adapted to store at least some intermediate data used to determine the updated check node values.

Still another embodiment may be a method of updating terms of a matrix row by serially progressing through the row. The method comprises repeating a process for each of a plurality of terms in a matrix row, where the process comprises summing a current term with a first update value and, unless the current term comprises a value less than that of matrix row terms preceding the current term, summing the current term with a second update value. The process further comprises, if the current term comprises a value less than that of matrix row terms preceding the current term, altering the second update value based on the first update value. The method also comprises updating at least some terms in the matrix row using the first and second update values.

BRIEF DESCRIPTION OF THE DRAWINGS

For a detailed description of exemplary embodiments of the invention, reference will now be made to the accompanying drawings in which:

FIG. 1 shows a block diagram of a decoder architecture in accordance with a preferred embodiment of the invention;

FIG. 2a shows an exemplary parity check macro-matrix and FIG. 2b shows an exemplary submatrix of the parity check macro-matrix;

FIG. 3 shows a block diagram of the structure of a parity check update block in accordance with a preferred embodiment of the invention;

FIG. 4 shows an exemplary parity check macro matrix;

FIG. 5 shows a table listing parity check update block input indices and output indices;

FIG. 6 shows a second block diagram of the decoder architecture of FIG. 1 in accordance with a preferred embodiment of the invention;

NOTATION AND NOMENCLATURE

Figure 7:
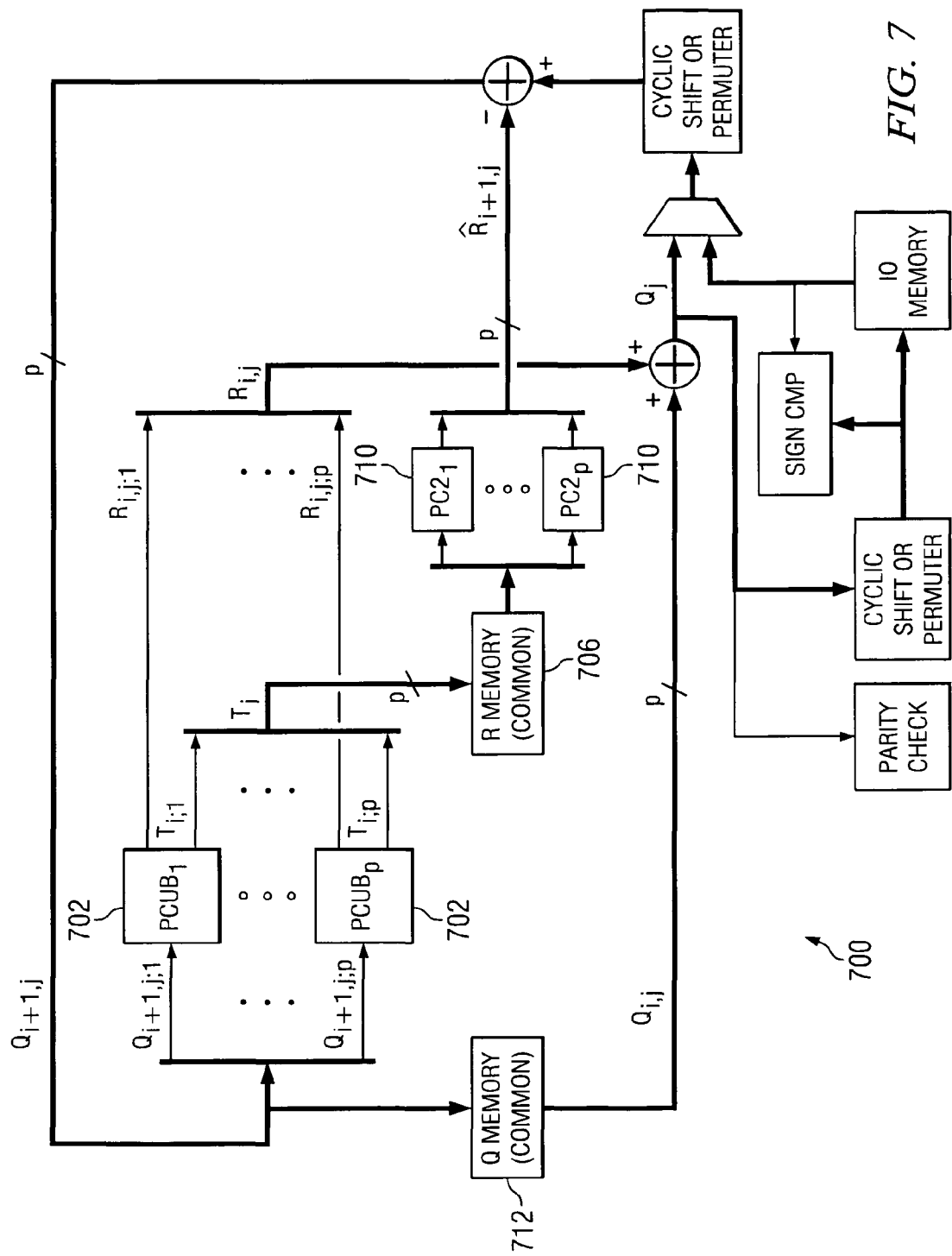
FIG. 7 shows a third block diagram of the decoder architecture of FIG. 1 in accordance with a preferred embodiment of the invention.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. Further, the special addition notation "[+]" is defined as:

$$x\,[+]\,y = \log\left(\frac{1 + e^{(x+y)}}{e^x + e^y}\right)$$

where x and y may be any suitable values. The notation "[+]" is not, however, limited to this definition and may instead be any approximation thereof.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Disclosed herein is a layered mode decoder architecture capable of decoding any of a variety of Low Density Parity Check (LDPC) codes. According to the LDPC class of codes, a sparse matrix H defines the code, with the encodings, or codewords, c of the payload data (i.e., data to be transmitted) satisfying:

$$Hc=0 \tag{1}$$

over Galois field GF(2). Each codeword c consists of the source message s combined with the corresponding parity check bits for that source message s. The encodings c are transmitted, with the receiving network element receiving a signal vector r=c+n, n being the noise added by the channel. Because the decoder at the receiver knows matrix H, it can compute a vector z=Hr. However, because r=c+n, and because Hc=0:

$$z=Hr=Hc+Hn=Hn \tag{2}$$

The decoding process thus involves finding the sparsest vector x that satisfies the equation:

$$Hx=z \tag{3}$$

over GF(2). The vector x becomes the best guess for noise vector n, which can be subtracted from the received signal vector r to recover encodings c, from which the original source message s is recoverable.

High-performance LDPC code decoders generally are difficult to implement into hardware. While Shannon's adage holds that random codes are good codes, it is regularity that allows efficient hardware implementation. To address this difficult tradeoff between code irregularity and hardware efficiency, the technique of belief propagation provides an iterative implementation of LDPC decoding that can be made somewhat efficient. Belief propagation decoding algorithms are also referred to as probability propagation algorithms, message passing algorithms, and as sum-product algorithms.

Iterative belief propagation algorithms are based on the binary parity check property of LDPC codes. The product of the correct LDPC code word vector with each row of the parity check matrix is zero. According to the belief propagation approach, the received data are used to represent the input probabilities at each input node (i.e., "bit node") of a bipartite graph having input nodes and check nodes. Within each iteration of the belief propagation method, bit probability messages are passed from the input nodes to the check nodes, updated according to the parity check constraint, with the updated values sent back to and summed at the input nodes. The data is typically represented as log likelihood ratios (LLRs) defined as:

$$L(c) = \log\left(\frac{P(c=0)}{P(c=1)}\right) \tag{4}$$

where c is a coded bit received over the channel.

In its conventional implementation, the belief propagation algorithm uses two value arrays, a first array L storing the LLRs for j input nodes, and the second array R storing the results of m parity check node updates, with m being the parity check row index and j being the column (or input node) index of the parity check matrix H. The general operation of this conventional approach determines, in a first step, the R values by estimating, for each check sum (row of the parity check matrix) the probability of one input node value from the other inputs used in that checksum. The second step of this algorithm determines the LLR probability values of array L by combining, for each column, the R values for that input node from parity check matrix rows in which that input node participated. A "hard" decision is then made from the resulting probability values, and is applied to the parity check matrix. This two-step iterative approach is repeated until (1) is satisfied (all parity check rows equal zero, GF(2)), or until another convergence criteria is reached, or a terminal number of iterations have been executed. LDPC decoding is discussed in further detail in commonly assigned U.S. application Ser. No. 10/329,597, entitled, "Hardware-Efficient Low Density Parity Check Code For Digital Communications," Publication No. U.S. 2004/0034828 A1, which is incorporated herein by reference.

My application Ser. No. 10/329,597, mentioned above, describes a low density parity check (LDPC) code that is particularly well adapted for efficient hardware implementation in a belief propagation decoder circuit. Specifically, the LDPC code is arranged as a macro-matrix whose rows and columns represent block rows and block columns of a corresponding parity check matrix. Each zero entry corresponds to an all-zero submatrix of dimensions p×p. Conversely, each non-zero entry corresponds to a permutation submatrix of dimensions p×p, such as a cyclically shifted identity matrix, with the shift corresponding to the position of the permutation submatrix entry in the macro-matrix. Thus, the macro-matrix serves as a form of "shorthand notation" for the parity check matrix. The columns of the macro-matrix are grouped, so that only one column in the macro-matrix group contributes to the parity check sum in any given row. The decoder circuitry includes a parity check value estimate memory which may be arranged in banks that can be logically connected in various data widths and depths. A parallel adder generates extrinsic estimates that are applied to parity check update circuitry for generating new parity check value estimates. These parity check value estimates are stored back into the memory, and are forwarded to bit update circuits for updating of probability values for the input nodes.

One approach toward iterative decoding is known as "layered decoding," in which the parity check matrix described above may be viewed as a collection of horizontal layers, or rows, and each layer may represent a component code. Layered decoding is performed by applying the decoding algorithm to each successive layer. Performing the decoding algorithm for a particular layer comprises using calculations obtained by decoding previous layers. Because the layered decoding algorithm may be performed using a parallelized decoding hardware, and more particularly because the layered decoding algorithm is substantially different from the conventional belief propagation algorithm, decoding performance may be superior to that of decoding processes not using the layered decoding algorithm and/or parallelized decoding hardware.

The belief propagation algorithm described above may be performed in a layered decoding mode, as shown by (5)-(11) below. The rows of the parity-check matrix are grouped into non-overlapping subsets, where each column in each subset has a maximum weight of one; that is, each column in each subset has a maximum of one entry. For example, layered decoding can be performed by taking each block row of a parity check matrix, consisting of p rows, as a layer in the decoding process. Each subset is processed as a unit, and the subsets are processed one after another, using results from the previous subset.

Essentially, layered decoding comprises using (5)-(11) below to determine the values of the received codeword c as they were prior to transmission. The codeword that is actually received consists of fractions (e.g., multivalued entries or soft data) instead of binary bits. In general, the fractions are used to calculate an array R containing an $R_{mj}$ value that corresponds to each entry of the parity check matrix. These $R_{mj}$ values are combined, by column, to form a vector L. The entry values $L(q_j)$ of the vector L represent the mathematical probabilities that each entry of the received codeword was originally a binary "0" bit or "1" bit prior to transmission. Accordingly, a vector c having binary bits is determined. Each entry of vector c corresponds to an entry of the vector L. For example, if a first entry of vector L contains a value indicating that that entry was a "0" bit prior to transmission, then the first entry of vector c may be assigned a "0" bit. Likewise, if the entry value of the fourth entry of the vector L indicates that the entry was most likely a "1" prior to transmission, then the fourth entry of the vector c may be assigned a "1." The accuracy of the decoding is then determined by verifying that (1) is true for the vector c and the parity check matrix H. If it is true, the vector c has been recreated on the receiver side as it was transmitted on the transmitter side. If (1) is not true, then another iteration of the process is executed. The process may end upon satisfying any of a variety of conditions, such as after completing a predetermined number of iterations or after determining (1) to be true.

Mathematically, the process begins with an initialized estimate for the LLRs $L(q_j)$, $\forall j$, using multivalued, received soft data. Typically, for additive white Gaussian noise (AWGN) channels, this initial estimate is $-2r_j/\sigma^2$, where $\sigma^2$ represents the noise of the channel. The per-row (or extrinsic) LLR probabilities are then derived:

$$L(q_{mj})=L(q_j)-R_{mj} \tag{5}$$

for each column j of each row m of the checksum subset. These per-row probabilities amount to an estimate for the probability of the input node value, excluding the contribution to the estimate from the row itself. In at least some embodiments, one can then derive a value $A_{mj}$ and a sign value $S_{mj}$ as shown in (6) below. The scope of disclosure is not limited to the equations given in (6)-(10); any portion of (6)-(10) may be substituted with any other suitable operation or approximation. Further, all of (6)-(10) may be completely replaced with an alternate, suitable algorithm:

$$A_{mj} = \sum_{n \in N(m); n \neq j} \Psi(L(q_{mn})) \tag{6}$$

While one may use any one of a number of computational forms for (6), or any other suitable computation/approximation technique besides (6) and variations thereof, an example of the function ψ according to a preferred embodiment of this invention is:

$$\Psi(x) \equiv \log(|\tan h(x/2)|) = \log(\tan h|x/2|) \tag{7}$$

The function ψ is its own negative inverse: ψ (ψ(x))=−|x|. For computational ease, one can express tan h(L/2) as:

$$\tanh\left(\frac{L}{2}\right) = \left(\frac{e^L - 1}{e^L + 1}\right) \tag{8}$$

The sign is determined from:

$$s_{mj} = \prod_{n \in N(m); n \neq j} \text{sgn}(L(q_{mn})) \tag{9}$$

which is an odd/even determination of the number of negative probabilities, excluding each column's own contribution. The updated estimate of each value $R_{mj}$ becomes:

$$R_{mj} = -S_{mj}\Psi(A_{mj}) \tag{10}$$

The negative sign preceding the $S_{mj}$ term in (10) is intentionally included because the function ψ is its own negative inverse. The value $R_{mj}$ thus corresponds to an estimate of the LLR for input node j as derived from the other input nodes in the mth row of the parity check matrix, not using the value for input node j itself.

In the second step of each decoding iteration, the LLR estimates for each input node are updated. According to the preferred embodiment of this invention, this is performed over each column (i.e., each input node) as follows:

$$L(q_j)=L(q_{mj})+R_{mj} \quad (11)$$

where the estimated value $R_{mj}$ is the most recent update, from equation (10) in this derivation. This column estimate will be used in the hard decision check. This is in contrast to the value of $R_{mj}$ that is used in equation (5) for this iteration, which is the value that was generated from the previous iteration over this subset of parity check matrix H.

The determination of whether the iterations have converged to an error free decoding is based on the per-column LLRs $L(q_j)$:

$$L(q_j) \geq 0, \Rightarrow c_j=0 \quad (12a)$$

$$L(q_j) < 0, \Rightarrow c_j=1 \quad (12b)$$

The codeword vector $c=\{c_0, c_1, \ldots c_N\}$ is then applied to the parity check matrix H to determine if the product is zero, which as noted above indicates that codeword vector c is a valid codeword, from which the payload data portion can be readily extracted. Layered decoding is discussed in further detail in the commonly assigned U.S. patent application "Layered Low Density Parity Check Decoding For Digital Communications," Ser. No. 10/806,879, which is incorporated herein by reference.

Block-partitioned parity check matrices, such as those described above, are generally known as irregular partitioned permutation (IPP) LDPC codes. The IPP-LDPC codes fall into a class of codes that may be defined as block structured codes with blocks having a weight of one (e.g., a block that is a cyclically shifted identity matrix). Their parity check matrices are block partitioned into square matrices of dimension p as above. However, the structure of each block or submatrix can be an arbitrary permutation matrix. More specifically, each row and each column have a weight of one, meaning that each row and each column contains all "0" bits and a single "1" bit entry. Cyclically shifted identity matrices are also permutation matrices, but with a more strictly defined structure. If all blocks are permutation matrices, the result is a regular code (i.e., every column has the same weight, and every row has the same weight). Irregular codes can be constructed by making some blocks zero matrices. Various such codes fall into a general class of codes. Such a class also may include a regular code block structure with cyclically shifted identity matrices. Irregular and regular codes using permutation matrices as the submatrices based upon Ramanujan graphs are also in this class, as well as arbitrary permutation matrices. Layered decoding may be applied to some or all of the codes in this class of codes, because the column weight within each block row is a maximum of one.

FIG. 1 shows a block diagram of a decoder 100 having such a layered mode architecture. The decoder 100 comprises, among other things, a Cyclic Shift or Permuter Module (CSPM) 102, parallel adder blocks 104, 106, an R memory 108, a Q memory 110, and a plurality of Parity Check Update Blocks (PCUBs) 112. Other components may be added as desired. There may be a number p of PCUBs 112, where p is also the dimensions of a p×p submatrix (i.e., parity check macro-matrix block). In general, the decoder 100 uses the algorithm outlined in operations (5)-(11) above to process incoming data. Specifically, the parallel adder block 104 is used to calculate (5); the PCUBs 112 are used to calculate (6), (9), and (10); and the parallel adder block 106 is used to calculate (11). The decoder 100 repeats the algorithm until the occurrence of some predetermined event, such as the completion of a predetermined number of iterations or the complete, successful decoding of incoming data.

FIG. 2a shows an exemplary embodiment of a parity check macro-matrix 200 comprising multiple rows 202, each of the rows 202 comprising multiple entries 204. As shown in FIG. 2b, each of the entries 204 of the macro-matrix 200 comprises a submatrix 248 (i.e., "block") that is a permutation matrix having dimensions p×p. More specifically, each entry 204 that is a "1" represents a submatrix 248 preferably comprising a cyclically shifted identity matrix. Conversely, each entry 204 that is a "0" or a blank represents a submatrix 248 preferably comprising all zero entries. Hence, each row 202 expands to a block row in the parity check matrix H; similarly for the columns. Because each row 202 represents a block row, the rows 202 may henceforth be referred to as block rows. Each of the PCUBs 112 processes single rows 250 of the parity check macro-matrix block rows 202, such as those shown in the submatrix 248 of FIG. 2b. The PCUBs 112 operate in a serial manner over each row 250. Thus, each entry of a row 250 preferably is processed sequentially. In at least some embodiments, the processing time for each entry may be approximately one clock cycle.

FIG. 3 shows the preferred structure of a PCUB 112. A PCUB 112 may comprise, among other things, a first operational module 300, a second operational module 304, and a temporary storage module 302 situated therebetween. Other components also may be included. By providing memory for data storage, the temporary storage module 302 allows the PCUB 112 to process more than one row 250 at a time. Specifically, as entries for a single row 250 enter a PCUB 112, they are processed in the first operational module 300. A portion of the results of the first operational module 300 may be stored in the temporary storage module 302 for impending use. Meanwhile, final computations for a row 250 in a different block row are completed in the second operational module 304 and terms associated with those final computations are output from the module 304 in a sequential manner.

Data blocks having size p words are passed between the various components of the decoder 100. These data blocks correspond to algorithm data from matrix blocks that are of size p×p, as described above. Because the blocks are generally permutation matrices, each block has p terms; one per column and one per row. The p terms of a matrix block may be thought of in vector form and organized in either row order or in column order. Row order implies that the vector terms are in the order of row $1, 2, \ldots, p$ of the matrix block. Column order implies that the vector terms are in the order of column $1, 2, \ldots, p$ of the matrix block. During portions of the execution of the algorithm described above, data from two or more different blocks may need to be combined. For this reason, the vectors of data mentioned above should be in the same order (i.e., both should be either column ordered or row ordered). Accordingly, the CSPM 102 may be used to rearrange the vectors so that all vectors involved in a particular algorithm computation step may be ordered in a substantially similar manner, if necessary.

A different notation may be used henceforth in reference to vectorized data or data blocks. Specifically, let $Q_{i,j}$ be $\{L(q_{\{i,j\}})\}$, but row ordered for block position i,j. Let $Q_j$ be $\{L(q_{\{j\}})\}$ over block column j, but row ordered according to the block of the mathematical operation or relation in which it appears. Also, let $R_{i,j}$ be $\{R_{\{i,j\}}\}$, but row ordered for block position i,j. Further, let $\hat{R}_{i,j}$ be $\{\hat{R}_{\{i,j\}}\}$, but row ordered for block position i,j and only referring to the data from a previous full iteration. Then, (5) may be expressed as $$Q_{i,j}=Q_j-\hat{R}_{i,j} \quad (13)$$

and then $R_{i,j}$ may be computed from $Q_{i,j}$ over all block columns j. $Q_j$ may subsequently be updated as in (11) as $$Q_j = Q_{i,j} + R_{i,j} \quad (14)$$

In computing the next block row, $$Q_{i+1,j} = Q_j - \hat{R}_{i+1,j} \quad (15)$$

could be obtained, which could also be written as $$Q_{i+1,j} = Q_{i,j} + R_{i,j} - \hat{R}_{i+1,j} \quad (16)$$

In some embodiments, an additional index k may be used below to refer to the relative row number within a particular block.

Referring again to FIG. 1 and assuming a parity check macro-matrix 200 of I block rows and J block columns, the decoder 100 processes the matrix 200 by moving across the block columns of a block row i, then moving across the next block row i+1, and so forth, until all block rows 202 have been processed, whereupon the processing wraps circularly from the last block row 202 again to the top block row 202. As discussed above, each PCUB 112 and the decoder 100 as a whole may process more than one block at a time. For example, during processing of block (i,j), the processing of a previous block (i-1,j) may almost be complete. The R memory 108 may store the $R_{i,j}$ data (sometimes referred to as "check node values") for all blocks for one previous iteration. The Q memory 110 may store the $Q_{i,j}$ data for the blocks of the most recent block row. The data in each matrix block that is stored in either the Q memory 110 or the R memory 108 may be in the row order defined by that particular block.

For example, (14) may be performed by retrieving data block $Q_{i,j}$ (sometimes referred to as an "extrinsic estimate") from the Q memory 110 and adding it to the $R_{i,j}$ data block being produced by the PCUBs 112. Because both the data blocks are in row order relative to the same block indices, they may be added together without the use of a CSPM 102. However, for (15), the data block $Q_j$ (sometimes referred to as a "probability value") may be reordered, such that $Q_j$, when subtracted as shown in (15), is row ordered relative to the block index (i+1, j). The $Q_j$ block may be reordered using any of a variety of techniques. In at least some embodiments, the $Q_j$ block may be put into column order, and then put into row order for block index (i+1, j). In other embodiments, the reordering may be accomplished in a single step. Specifically, if all blocks of the parity check matrix are cyclically shifted identity matrices, then the reordering may be accomplished with a circular shift of the data vector. If the blocks are general permutation matrices, then a general permutation of length p may be performed. If the parity check matrix blocks only use a restricted set of permutations, then a simpler permutation may be implemented.

Once the $Q_j$ block has been reordered by the CSPM 102, it may be combined with $\hat{R}_{i+1,j}$, which has been retrieved from the R memory 108, in the parallel adder block 104. The parallel adder block 104 may output, in turn, $Q_{i+1,j}$ as in (16), which also may be stored in the Q memory 110. By storing the data in the Q memory 110, some previous data may be replaced, since the Q memory 110 primarily stores only information from a single, previous block row. The data is also sent to the PCUBs 112, with one data word per PCUB 112.

The output of the PCUBs 112 is the $R_{i,j}$ data block. Because a PCUB 112 may use its first and second operational modules 300, 304 as well as the memory 302 to process more than one block row at a given time, the $R_{i,j}$ data block being output is for a block row previous to the one entering the PCUB 112. This output block $R_{i,j}$ is stored in the R memory 108, replacing at least some data previously stored in the R memory 108. The output block $R_{i,j}$ also is supplied to the parallel adder block 106, as discussed above.

Parity check matrices containing zero blocks may be processed in a manner different than that described above. Referring to the macro-matrix 400 shown in FIG. 4, the blank spaces in the matrix 400 denote "0" entries. Such matrices are processed by skipping over these "0" entries. Specifically, the matrix 400 may be processed by first expanding each position in the matrix 400 into a p×p binary submatrix (i.e., block), thus producing a matrix having 3p rows and 5p columns. The "1" entries in the matrix 400 may be expanded into permutation matrices that are specifically defined for their respective block positions. The Q blocks may enter the PCUBs 112 as before, in a row-by-row fashion, each applicable block column of each block row being completed before processing a subsequent block row. However, the R output blocks of the PCUBs 112 may be sequenced in a pattern different than that described above. In particular, the R blocks produced by PCUBs 112 may be from the same block column as the Q blocks input into the PCUBs 112, but they may also be from the first previous block row non-zero position. For the matrix 400, FIG. 5 shows a table listing the input Q block indices against the output R block indices. Accordingly, in at least some embodiments, at least some of the PCUBs 112 may contain additional hardware (e.g., additional memory) to store the data for an extended length of time.

In at least some physical implementations of the embodiments of the invention, pipelining registers may be inserted into the decoder 100 to correct for timing constraints introduced by the logic of the decoder 100, thus increasing potential clock frequencies. However, the addition of such hardware may necessitate the adjustment of the input Q and output R block indices, so that timing inconsistencies do not inadvertently precipitate improper execution of the decoding algorithm (i.e., the mathematical calculations).

Decoding may be initialized by providing the decoder 100 with the data received over a communication channel. This received data may be injected into the algorithm in the $Q_j$ data during the first iteration. During the first iteration, for the first instance of a non-zero block of each block column, the corresponding initial $Q_j$ for that block column may be used. The received data may physically be injected into the decoder 100 by preloading the Q memory 108 with the data, although the scope of disclosure is not limited to this technique. For instance, the received data may be provided to the decoder 100 by way of a separate memory or some other input connection. FIG. 6 shows the decoder 600 comprising such a memory, IO Memory 601. The IO Memory 601 may be preloaded with the input channel (i.e., received) data and during the first decoding iteration, this data may be supplied directly to the CSPM 102, thus inserting the received data into the decoding algorithm. In some embodiments, each $Q_j$ data block may be in linear column order and may be reordered as necessary by the CSPM 102.

Decoding may be stopped when any of a variety of predetermined criteria is met. For example, in some embodiments, the decoder 600 may continue to decode until a certain number of iterations have been completed. In other embodiments, the decoder 600 may continue decoding until all parity checks have been satisfied. Referring again to FIG. 6, the decoder 600 comprises a parity check unit 602 that may be used to compute the parity checks by determining specific, decoded bits from the "soft" information. In at least some embodiments, this is accomplished by serially performing the exclusive-or ("XOR") function of the $Q_j$ data across each layer, on each individual row. The decoder 600 may monitor sign differences or differences in decoded bit values by storing $L(q_j)$ values from a most recently updated layer and reading the values when a comparison is to be performed. For example, the $L(q_j)$ values may be stored into and read from the IO Memory 601. As explained above, the $Q_j$ values are the row-ordered version of the $L(q_j)$ values. To facilitate comparison on a column-wise basis, each $Q_j$ block may be reordered into a linear column order by a CSPM 604. When decoding ceases upon meeting some predetermined criteria, the final output data (i.e., the $Q_j$ data for all block indices across a virtual row) will be stored in the IO Memory 601 and may be retrieved for use by a device (e.g., receiver) containing the decoder 600. If only decoded bits are the desired output, then the CSPM 604 operates on a bit vector of width p. Similarly, the IO Memory 601 may only store and read these bit vectors and the Sign Compare Unit 610 may only compare bits.

The two-module PCUB 112 described above is only one of a variety of hardware implementations that may be used for decoding in the context of this disclosure. Various mathematical approaches may be used to perform the computations (6), (9) and (10). In addition, various approaches also may be used to approximate these computations instead of actually performing the computations. With any approach used to obtain a result pertaining to (6), (9) and (10), a corresponding hardware also may be used.

One mathematical approach that may be used to effectively compute (6), (9) and (10) is as follows. The first operational module 300 of the PCUB 112 may compute $$A_m = \sum_{n \in N(m)} \Psi(L(q_{mn})) \qquad (17)$$

where this sum is accumulated one term at a time as the row terms arrive sequentially, block by block, and is finally stored in the PCUB temporary storage module 302. The second operational module 304 then may compute $$A_{mj} = A_m - \Psi(L(q_{mj})) \qquad (18)$$

and $R_{mj}$ as in (10), where the subtracted terms of (18) may have been stored in the temporary storage module 302 or may have been recomputed from the $Q_{i,j}$ data in the Q memory 110. Similar operations may be performed for sign terms.

One approximation approach for (6), (9) and (10) is known as the min-sum algorithm. In the min-sum algorithm, the magnitude of each updated term on a row is set to the minimum absolute value of all of the row terms, except for the row term for which this minimum occurs. Instead, that term is set to the next largest absolute value of the row terms. Signs may be assigned as in (6), (9) and (10).

Another approximation approach for (6), (9) and (10) is known as the λ-min algorithm, which is somewhat similar to the min-sum algorithm. The term λ denotes the number of minimum terms in a row that are to be used. This number preferably is a fixed quantity, such as 2, 3 or 4. The algorithm is performed by finding λ number of minimum terms and computing the updated terms using only these values, as in the min-sum algorithm (i.e., each updated row term is computed only from these minimum terms).

Either of these approximation algorithms may be implemented using the PCUB 112 hardware shown above. In particular, in the first computation module 300, the minimum value, or λ minimum values, may be determined as the data arrives into the PCUB 112 in a serial fashion. This minimum term(s) may be saved along with corresponding indices in the temporary storage module 302. In the second computation module 304, the final selection and possible further computation may be performed for each term, the form of which may depend on the index of the output term.

For the λ-min algorithm, some of the computations for combining minimum terms may be performed in the first computation module 300 in order to lessen the hardware requirements in the second computation module 304. For example, if the minimum number of terms is 3 (i.e., λ=3), the sum between the current input term and the first minimum may be computed in the first computation module 300, storing the result only when this input term replaces the first minimum term or the second minimum term. After completion of the algorithm, this stored result will be that sum between the first and the second minimum terms. Thus, this sum may not need to be computed in the second computation module 304.

Yet another approximation algorithm is the A-Min algorithm which may be used to approximate (6), (9) and (10). The algorithm comprises finding the minimum absolute value and respective index of the row terms. Two update terms also are computed; one is termed Total Sum ("TS") and the other is termed Sum Less Minimum ("SLM"). TS is computed by forming a sum of all row terms, where the sign is included. The TS value is assigned as the update value for all row terms except that for which the minimum term occurs. The SLM term is computed by forming a sum of all row terms except for the minimum term. This SLM value is assigned as the update term for the minimum term. The minimum value, index, TS and SLM all are computed serially in the first computation module 300. In particular, the SLM computation may be performed in the module 300 as follows. Assuming there are r terms in the row and that $TS_j$ is the partial total sum using only row terms 1 through j, and also assuming $SLM_j$ signifies the partial SLM value using only the row terms 1 through j, and further assuming the next row term is labeled $V_{j+1}$ (i.e., some $L(q_{mn})$), when this term arrives, $TS_{j+1} = TS_j [+] V_j$ may be computed in a serial fashion. Thus, for j=2, . . . , r, each next $SLM_j$ may be computed as follows:

If $|V_j|$ is the next new minimum: $SLM_j = TS_{j-1}$

Else: $SLM_j = SLM_{j-1} [+] V_j$.

Of course, these computations are only illustrative of one embodiment. Other embodiments may use any of a variety of suitable computations or approximations. In particular, other suitable approximations may be associated with the "[+]" operator.

$SLM_1$ may be set to infinity, or $SLM_2$ may be set to $V_2$ for j=2 if $|V_j|$ is not the next new minimum above. After the last term in the row has been processed, TS, and SLM, may be the final values for these terms without subscripts. Thus, SLM may be computed in a serial fashion in the first computation module 300. The final TS, SLM and relative index for the minimum values may be stored in the temporary storage module 302 for subsequent use in the second computation module 304. Processing within the module 304 may comprise assigning to the output the TS value unless the output index matches the stored minimum index, in which case SLM is assigned to the output.

As previously mentioned, the decoder 600 is able to decode a variety of codes. One code type varying factor is block size. Codes with block size $p_1$ may be decoded within the decoder 600 architecture, where $p_1 < p$. Only $p_1$ data terms are active in the data buses, memory words and computation units. These data terms preferably are the first $p_1$ terms of the architecture's p length vectors. In such situations, all CSPMs in the decoder 600 should be fabricated with the capability to operate upon data blocks of size smaller than a maximum of p.

Another varying factor may include macro-matrix dimension. Specifically, the number of block rows and block columns in the parity check matrix may be flexible. Any dimensions may be used, as long as the storage space provided in the decoder 600 (e.g., the Q memory 110, the R memory 108) is not exceeded and the PCUB 112 computational capabilities are not exceeded. For a given value of p, an appropriate memory size for memories 108, 110 is determined by the number of non-zero blocks within the parity check matrix and the number of blocks in a block row. In some embodiments, various components of the decoder 600 may have maximum capacities that they can handle. As long as these capacities are not exceeded, the decoder 600 may handle macro-matrices of virtually any dimension. A controller that controls the decoder 600 would know the particular matrix definition and sizing parameters (e.g., by way of programming), and would operate accordingly. Changing the ratio of the number of block rows to block columns in a matrix alters the code rate. Thus, the decoder architecture described herein also allows for the decoding of a variety of code rates.

A third varying factor may be matrix definition. The decoder architecture presented herein may be implemented such that the definition of the parity check matrix is flexible (e.g., the specification of which blocks are zero blocks, which blocks are non-zero blocks and the permutations/shift values for these non-zero blocks). As above, as long as the hardware limits of the decoder 600 components are not surpassed, matrices of virtually any definition or constitution may be used. A controller coupled to the decoder architecture may have information pertaining to these limitations (e.g., by way of programming), and may apply this information accordingly during a decoding process.

By storing data in a different form than in the embodiments above, some of the embodiments presented below may have substantially reduced memory requirements. FIG. 7 shows a decoder 700 having a plurality of PCUBs 702 whose temporary storage modules 302, in at least some embodiments, store output data (i.e., $T_i$) directly into the R memory 706. The $T_i$ data block consists of p data items; one item from each PCUB 702. This is the data that is used in the second computation module 304 of each PCUB 702 to produce $R_{i,j}$ data blocks for a data row i. This data item from any PCUB 702, such as $T_{i,3}$, from PCUB$_3$, may be particular to row 3 of the block row i and may consist of the data necessary within the second computation module 304 to produce some or all of the terms $R_{i,j,3}$ for row 3. Generally, this data also is stored in the temporary storage module 302 of that PCUB 702. Thus, it is not particular to any column or block column as is each $R_{i,j}$ data block. The data block $T_i$ represents data for an entire block row. This $T_i$ data block may only need to be output once per block row and not repeatedly for each $R_{i,j}$ data block on block row i. Also, in at least some embodiments, this data may be split into smaller pieces and output over multiple cycles in order to allow for the use of narrower buses and memory words.

Still referring to FIG. 7, also shown are multiple PC2 710 units following the R memory 706. These units are substantially similar or, in some embodiments, identical to the second computation modules 304 and portions of the temporary storage modules 302. The purpose of the PC2 710 units is to repeat the operations performed in the second computation modules 304 in order to reproduce $R_{i,j}$ data, this time one iteration later in time than in the PCUBs 702 and thus labeled $\hat{R}$. When the $R_{i,j}$ data is needed for a subsequent block row, the R memory 706 may be read and the data stored in the PC2 710 units and also may be used to complete the parity check update computations as previously performed in the second computation modules 304 of the PCUBs 702.

Figures 8, 9:
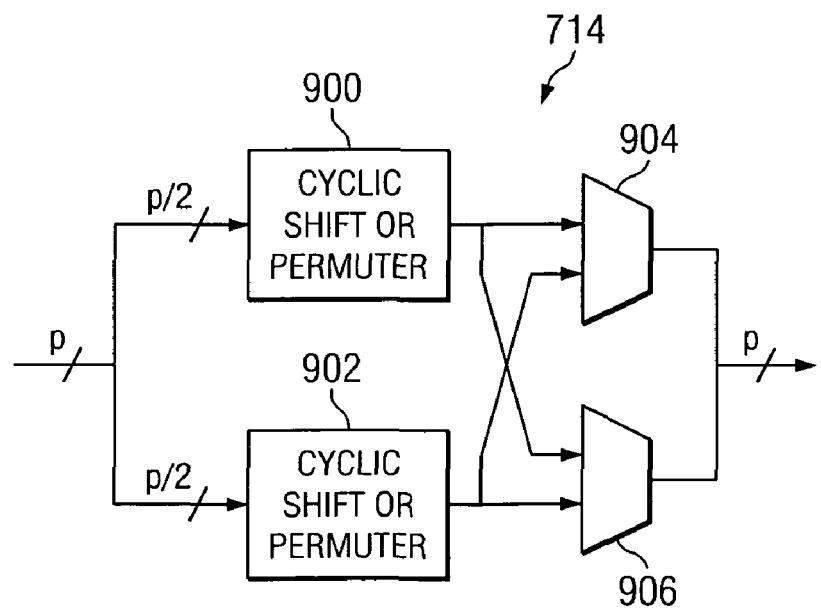
FIG. 8 shows an exemplary 9-by-24 parity check macromatrix organized into quad blocks.
FIG. 9 shows a block diagram of a split Cyclic Shift or Permuter Unit structure, in accordance with embodiments of the invention.

In some situations, the code to be decoded may have a block size parameter $p_1$ that is substantially less than the decoder's block size parameter of p. Specifically, in these situations, $2p_1$ may be less than or equal to p. In the embodiments presented below, multiple data blocks may be processed at one time within the decoder architecture for portions of the parity check matrix. For the case where $2p_1$ is less than or equal to p, four contiguous block positions may be processed, although the scope of disclosure also encompasses larger and smaller sets of blocks. These block groups may be termed "quad blocks." Within a parity check matrix, the quad blocks consist of four blocks arising from the intersection of two consecutive block columns with two consecutive block rows. Thus, the quad blocks form a $2p_1$ by $2p_1$ block. FIG. 8 shows a macro-matrix 800 having such quad blocks 802. Because there are an odd number of block rows, the grouped blocks of the last block row only contain two blocks.

Under some conditions, a quad block 802 may be processed as a combined data block within the decoder architecture in a single step, substantially similar to the fashion in which a single block is processed. If the quad block 802 contains precisely two non-zero blocks and those non-zero blocks are not on the same block row or block column, then most of the conditions for combined processing are met for that quad block 802. Such quad blocks 802 are termed "qualified quad blocks."

There exist two types of block processing in the decoder architecture: single block processing and quad block processing. As described above, single block processing refers to processing one of the blocks of the matrix of size $p_1$ by $p_1$. Accordingly, the single block data size is a vector of length $p_1$. Since the decoder architecture allows processing of up to p terms, portions of the hardware will be idle such as PCUBs and at least some portions of data buses. The dimensions of these are $p-p_1$. Quad block processing may refer to the combined processing of two single blocks that are part of a qualified quad block as discussed above. For these situations, $2p_1$ data items are processed and there also may be a portion of idle hardware depending upon the value $p-2p_1$.

In at least some embodiments, the Q memory 712 and possibly the R memory 706 may be partitioned into an upper half and a lower half according to word width. These upper and lower portions may correspond to the upper and lower portions of the data vector discussed above, respectively. In this way, an upper half word may be read from one address and a lower half word may be read from a different address. Furthermore, as shown in FIG. 9, the CSPM 714 may comprise two separate units, each of which may operate on data of width $p_1$. The incoming data bus of width p may be split into an upper half and a lower half, as above. Following these reorder units may be circuitry (e.g., multiplexers) that may be used, for example, to swap the upper and lower halves of the data.

The processing may proceed in a fashion by sequencing through the quad blocks across a row group, then moving down to the next row group. If a quad block is empty (i.e., all zero matrices) the quad block may be skipped; otherwise, the quad block may be processed. If the quad block is a qualified quad block, the quad block may be processed as a quad block with data length $2p_1$. If the quad block is not processed as a quad block, then the non-zero blocks it contains may be processed as single blocks through the architecture.

When the blocks of a quad block must be processed singly, the blocks may be processed one at a time. However, if there exist two non-zero blocks in the same block column, one above the other, then the processing for the lower block may be delayed. Such a lower block is dependent upon the results of the block above and those results cannot be obtained until the above block row has completed processing in the first computation module 300. The other non-zero blocks of this quad block may currently be processed during the first pass across the group row. After completion of the first pass over the group row, any remaining, unprocessed lower single blocks may be processed in a second pass of the group row.

The processing of a single block may be substantially similar to the processing of a single block in the architecture previously described. However, in the current architecture, only $p_1$ data items are occupied in either the upper half or the lower half of the memory word, buses and computation modules. Preferably, an upper half will be used if the data is from an odd numbered block row; a lower half will be used if the data is from an even numbered block row. The scope of disclosure is not limited to this configuration; other configurations also may be used. To compute the $Q_j$ data, a data block immediately above a current block may be referenced. This referenced, single data block may come from an even numbered block row if the active target block comes from an odd numbered block row. Conversely, the referenced, single data block may come from an odd numbered block row if the active target block comes from an even numbered block row. Thus, there may exist a need to move the reference data block from a lower half of the vector to an upper half, or from an upper half to a lower half. The separate units 900, 902 of the CSPM 714 shown in FIG. 9 may be used to rearrange the data block row or column orders as previously described and the multiplexers 904, 906 may be used to move the rearrange the entire data blocks accordingly.

A qualified quad block may be processed at an appropriate time, given that there are no conflicts in obtaining the data blocks upon which the qualified quad block is dependent for computing $Q_j$. Such a conflict does not occur when the two required, single blocks are not both on the same block row. However, if both of these required, single blocks are on the same block row, they may occupy either the lower half or the upper half of the architecture data vector and thus cannot both be accessed from memory or PCUBs simultaneously. Thus, such a data access conflict may necessitate the processing of a qualified quad block as single blocks that are processed in successive order.

The processing of a qualified quad block may be substantially similar to the processing of a block in the decoder architecture described above. However, in processing a qualified quad block, there may be $2p_1$ active data terms being processed by the architecture at a given time. These active data terms may be located in the upper half and in the lower half of the overall data vector, memory words and computation units, as described above.

To obtain the necessary $Q_j$ data upon which the active quad block is dependent, blocks from previously processed block rows may need to be accessed. Data from two single blocks may be required; one from an even numbered block row and another from an odd numbered block row. These single blocks may or may not occupy the same quad block. The data for both of the single blocks may be obtained simultaneously because they both do not occupy the same half side of the vector and because the Q memory 712 has been split into upper and lower portions, thus allowing for the use of different memory access addresses. Further, when the single block from an odd numbered block row is dependent upon a block from an even numbered row, and the single block from the even numbered block row is dependent upon a block from an odd numbered block row, the data block positions may be swapped when reordering $Q_j$.

The architectures described above also may process codes with block sizes that are larger than p, as long as the blocks are not larger in size than 2p. Such large blocks may be split into multiple portions (e.g., into two portions), each portion smaller than or equal in size to p. Each data block of size equal to or less than p may be processed in two steps; one step for the first data block portion and the second step for the second data block portion. In this way, the entire, original data block is processed. However, when the $Q_j$ data block is reordered in a CSPM of one of the architectures described above, the entire, original data block may need to be effectively processed as a whole, instead of in two separate portions. Accordingly, pipeline registers may be used in the data flow (and other hardware alterations also may be made) near or within the CSPM to enable the decoder architecture to process the entire, original block when the $Q_j$ data block is reordered.

The above discussion is meant to be illustrative of the principles and various embodiments of the present invention. Numerous variations and modifications will become apparent to those skilled in the art once the above disclosure is fully appreciated. For example, numerous other configurations of memories, hardware, supporting logic and operation sequencing can be used to implement either the algorithm(s) presented above, or variations thereof. Solutions involving any number of memories may be used. It is intended that the following claims be interpreted to embrace all such variations and modifications.

What is claimed is:

1. A system for decoding in layers data received from a communication channel, comprising:
a first adder module configured to determine an extrinsic estimate using a probability value estimate and a check node value estimate, the probability value estimate and the check node value estimate associated with a parity check matrix;
a plurality of parity check update modules (PCUMs) in parallel with each other, coupled to the first adder module and configured to update the check node value estimate; and
a second adder module coupled to the plurality of PCUMs and configured to update the probability value estimate using the extrinsic estimate and the updated check node value estimate;
wherein the PCUMs process at least some columns of at least some rows of the parity check matrix in a serial fashion.

2. The system of claim 1, wherein at least one of the plurality of PCUMs comprises a storage element and multiple processing units.

3. The system of claim 2, wherein at least some of the multiple processing units simultaneously process a different data block.

4. The system of claim 1, wherein the system determines changes in decoded bits of the parity check matrix.

5. The system of claim 1, wherein the system stops decoding based on at least one of changes in decoded bits of the parity check matrix and a result of the parity check matrix.

6. The system of claim 1, wherein the number of PCUMs is substantially similar to a dimension of a parity check submatrix, said submatrix is a square matrix represented in a parity check macro-matrix as a single data entry.

7. The system of claim 1, wherein the system is capable of processing data blocks of different dimensions.

8. The system of claim 1, wherein the system is capable of processing received data at different code rates.

9. The system of claim 1, wherein the system is capable of processing parity check matrices having at least one of different numbers of block rows and different.

10. The system of claim 1, wherein the system is capable of processing parity check matrices having at least one of different shift values, different non-zero block distributions and a different quantity of non-zero blocks.

11. The system of claim 1, further comprising a cyclic shift or permuter module (CSPM) that rearranges data.

12. The decoder of claim 1, wherein the system processes a data block having dimensions larger than the dimensions of a decoder block size parameter by dividing the data block into multiple data block portions.

13. The decoder of claim 12, wherein said multiple data block portions are processed sequentially.

14. A decoder usable in a communication system, comprising:
- multiple parity check update modules (PCUMs) configured to update check node values associated with a parity check matrix;
- an adder module coupled to at least one PCUM and configured to update probability value estimates associated with the check node values; and
- a cyclic shift or permuter module (CSPM) coupled to at least one PCUM and configured to rearrange data;
- wherein the decoder is capable of simultaneously processing groups of data blocks.

15. The decoder of claim 14, wherein the decoder simultaneously processes groups of data blocks when a decoder block size parameter is at least twice as large as a block size parameter in said groups of data blocks.

16. The decoder of claim 14, wherein a group of data blocks comprises four blocks of a parity check macro-matrix.

17. The decoder of claim 14, wherein the decoder stops processing based on at least one of changes in decoded bits of the parity check matrix and a result of the parity check matrix.

18. The decoder of claim 14, wherein the decoder determines changes in a sign of at least some of the probability value estimates.

19. The decoder of claim 14, wherein multiple non-zero blocks in the same group of data blocks and in a same block column are individually processed by the decoder.

20. The decoder of claim 14, wherein at least one of the multiple PCUMs comprises multiple processing units and a storage element.

21. The decoder of claim 14, wherein the CSPM rearranges data.

22. The decoder of claim 14, wherein the decoder comprises a memory partitioned into multiple portions, at least one of which stores a check node value.

23. A decoder usable in a communication system, comprising:
- multiple parity check update modules (PCUMs) configured to determine updated check node values associated with a parity check matrix;
- an adder module coupled to at least one PCUM and configured to update probability value estimates associated with the check node values;
- a cyclic shift or permuter module (CSPM) coupled to at least one PCUM and configured to rearrange data; and
- a memory coupled to at least one of the PCUMs and configured to store at least some intermediate data used to determine the updated check node values.

24. The decoder of claim 23, wherein the intermediate data is divided into portions before the intermediate data is stored by the memory.

25. The decoder of claim 23 further comprising a module coupled to the memory and configured to perform at least some operations substantially similar to those of at least one of the PCUMs.

* * * * *